(12) United States Patent
Yu et al.

(10) Patent No.: US 8,934,240 B2
(45) Date of Patent: Jan. 13, 2015

(54) HEAT-DISSIPATING MODULE

(75) Inventors: Ching-Hsiang Yu, Taoyuan Hsien (TW); Fu-Mei Hsu, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 337 days.

(21) Appl. No.: 13/467,322

(22) Filed: May 9, 2012

(65) Prior Publication Data
US 2013/0258589 A1 Oct. 3, 2013

(30) Foreign Application Priority Data

Mar. 30, 2012 (TW) .............................. 101111386 A

(51) Int. Cl.
H05K 7/20 (2006.01)

(52) U.S. Cl.
CPC ................................. *H05K 7/20172* (2013.01)
USPC ....................................................... 361/694

(58) Field of Classification Search
CPC ............................... H05K 7/20172; F28F 9/00
See application file for complete search history.

(56) References Cited

U.S. PATENT DOCUMENTS

| 4,780,062 | A  | 10/1988 | Yamada et al. |
| 4,923,000 | A  | 5/1990  | Nelson |
| 7,061,161 | B2 | 6/2006  | Scher et al. |
| 7,278,271 | B2 | 10/2007 | Chou et al. |
| 7,358,649 | B2 | 4/2008  | Scher et al. |
| 7,742,299 | B2 | 6/2010  | Sauciuc et al. |
| 7,793,709 | B2 | 9/2010  | Mukasa et al. |
| 8,081,454 | B2 | 12/2011 | Ishikawa et al. |
| 2006/0245614 | A1 | 11/2006 | Ishikawa |
| 2006/0268534 | A1 | 11/2006 | Paydar et al. |
| 2007/0036658 | A1 | 2/2007  | Morris |
| 2009/0213555 | A1* | 8/2009 | Wang et al. .................... 361/719 |
| 2011/0005733 | A1* | 1/2011 | Wada et al. .................... 165/121 |
| 2011/0014069 | A1 | 1/2011  | Wada et al. |
| 2011/0064594 | A1 | 3/2011  | Wada et al. |
| 2011/0120679 | A1 | 5/2011  | Tanaka |
| 2011/0150669 | A1 | 6/2011  | Frayne et al. |

FOREIGN PATENT DOCUMENTS

| JP | S63-14900   | 1/1988  |
| JP | S63-126597  | 8/1988  |
| JP | H01-94651   | 4/1989  |
| JP | H01-83200   | 6/1989  |
| JP | H02-49999   | 2/1990  |
| JP | H03-95100   | 9/1991  |
| JP | H10-96576   | 4/1998  |
| JP | 2000-323882 | 11/2000 |

(Continued)

*Primary Examiner* — Gregory Thompson
(74) *Attorney, Agent, or Firm* — Kirton McConkie; Evan R. Witt

(57) ABSTRACT

A heat-dissipating module is disposed within an electronic device. The heat-dissipating module includes at least one vibration element, a bracket, and a driving unit. The vibration element includes a working part and a free end. The bracket is connected with the working part of the at least one vibration element. The driving unit is connected with the bracket. When the driving unit drives the bracket to vibrate at a vibration frequency, the vibration element is moved with the bracket, and a resonant vibration causes the free end of the vibration element to generate a displacement, so that an airflow is generated at the free end of the vibration element to cool the electronic device.

14 Claims, 12 Drawing Sheets

(56) References Cited

FOREIGN PATENT DOCUMENTS

| JP | 2008-138558 | 6/2008 |
| JP | 2010-31708 | 2/2010 |
| KR | 10-2011-0097552 | 8/2011 |
| TW | 378424 | 1/2000 |

* cited by examiner

HEAT-DISSIPATING MODULE

FIELD OF THE INVENTION

The present invention relates to a heat-dissipating module, and more particularly to a heat-dissipating module for generating an airflow by using a resonant effect.

BACKGROUND OF THE INVENTION

Nowadays, many electronic devices are developed toward minimization, portability and high performance. Consequently, the electronic components within these electronic devices must have high power or high integration level. During operation of the electronic devices, the electronic components may generate energy in the form of heat, which is readily accumulated and difficult to dissipate away. If no proper heat-dissipating mechanism is provided to transfer enough heat to the ambient air, the elevated operating temperature may result in damage of the electronic components, a breakdown of the whole electronic device or reduced operation efficiency. Therefore, it is important to dissipate the heat from the electronic components and control the temperature of the electronic device.

Generally, the heat-dissipating mechanisms used in the electronic device are divided into an active heat-dissipating mechanism and a passive heat-dissipating mechanism.

In accordance with the active heat-dissipating mechanism, an axial-flow fan or a blower is disposed within the electronic device to result in a relatively higher capacity of airflow. Consequently, the heat generated by the electronic device can be effectively exhausted to the surroundings. However, during operation of the axial-flow fan, undesired noise is generated. In addition, the axial-flow fan has bulky volume. Moreover, since the service life of the axial-flow fan or the blower is not long, the axial-flow fan or the blower is not suitably used in the small-sized and portable electronic device to dissipate away heat.

In accordance with the passive heat-dissipating mechanism, heat pipes and/or fins are disposed within the electronic device. Through the heat pipes and/or fins, the heat generated by the electronic components of the electronic device is transferred to the casing of the electronic device. The heat is further transferred to the ambient air by natural convection. However, the heat-dissipating efficiency of the passive heat-dissipating mechanism is inferior to the active heat-dissipating mechanism. Moreover, for increasing the heat-dissipating efficiency of the passive heat-dissipating mechanism, the heat pipes and the fins should be made of high thermally-conductive material. Under this circumstance, the fabricating cost is increased and the material selection is restricted.

For solving the above drawbacks, some other heat-dissipating mechanisms using a piezoelectric actuator have been disclosed. The use of the piezoelectric actuator may drive vibration of blades to generate airflow.

FIG. 1 schematically illustrates a conventional heat-dissipating mechanism disclosed in U.S. Pat. No. 7,061,161, which is entitled "Small piezoelectric air pumps with unobstructed airflow". FIG. 2 schematically illustrates a conventional heat-dissipating mechanism disclosed in U.S. Pat. No. 7,358,649, which claims priority from U.S. Pat. No. 7,061,161. In these disclosures, an end of a T-shaped blade is connected with a piezoelectric element. The piezoelectric element drives the other end of the T-shaped blade to vibrate up and down. Consequently, an airflow is provided to cool the electronic device.

FIG. 3 schematically illustrates a conventional heat-dissipating mechanism disclosed in U.S. Pat. No. 7,742,299, which is entitled "Piezo fans for cooling an electronic device". In this embodiment, at least one piezo fan is disposed on a back side of a printed circuit board (PCB). During operation of the piezo fan, an airflow is generated to cool the PCB.

FIG. 4 schematically illustrates a conventional heat-dissipating mechanism disclosed in U.S. Patent Publication No. 20110014069, which is entitled "Piezoelectric fan device and cooling apparatus using the piezoelectric fan device". A piezoelectric fan comprises a blade and an actuator. The piezoelectric fan is fixed on a support member. When a voltage provided by a power supply is applied to the actuator through the support member, the actuator drives the blade to vibrate. Consequently, an airflow is generated.

FIG. 5 schematically illustrates a conventional heat-dissipating mechanism disclosed in U.S. Patent Publication No. 20110150669, which is entitled "Non-propeller fan". The both ends of a flexible membrane are fixed. By utilizing electromagnetic force to drive vibration of the flexible membrane, an airflow in a fixed direction is generated.

FIG. 6 schematically illustrates a conventional heat-dissipating mechanism disclosed in U.S. Pat. No. 7,793,709, which is entitled "Jet generating device and electronic apparatus". A vibration plate is disposed within the housing. By the vibration plate, the housing is partitioned into an upper chamber and a lower chamber. A voice coil motor is disposed within the housing, and partially attached on the vibration plate. The voice coil motor may drive the vibration plate to vibrate. The sinusoidal vibration of the vibrating plate causes the volume in the upper chamber and the lower chamber to increase or decrease. The change of the volume in the upper chamber and the lower chamber causes the airflow to be ejected out from the nozzles.

Since the above conventional heat-dissipating mechanisms are capable of dissipating heat in a single direction, the airflow direction is restricted, and it is difficult to reduce the volume of the electronic device.

Therefore, there is a need of providing an improved heat-dissipating module in order to eliminate the drawbacks encountered from the prior art.

SUMMARY OF THE INVENTION

The present invention provides a heat-dissipating module. The heat-dissipating module includes at least one vibration element, a bracket, a driving unit, and a substrate. The vibration element includes a working part and a free end. The working part of the vibration element is connected with the driving unit through the bracket. The driving unit may drive the vibration element to vibrate up and down. Moreover, due to a resonant vibration, the free end of the vibration element generates a large displacement. Consequently, an airflow is generated to cool the heat source of the electronic device. Since the vibration element is smaller and thinner than the axial-flow fan or the fins, the overall volume and thickness of the heat-dissipating module are obviously reduced, the space utilization of the electronic device is enhanced, and the electronic device is slim.

In accordance with an aspect of the present invention, there is provided a heat-dissipating module. The heat-dissipating module includes at least one vibration element, a bracket, and a driving unit. The vibration element includes a working part and a free end. The bracket is connected with the working part of the at least one vibration element. The driving unit is connected with the bracket. When the driving unit drives the bracket to vibrate at a vibration frequency, the vibration element is moved with the bracket, and a resonant vibration causes the free end of the vibration element to generate a displacement, so that an airflow is generated at the free end of the vibration element.

In accordance with another aspect of the present invention, there is provided a heat-dissipating module. The heat-dissipating module includes at least one vibration element and a driving unit. The vibration element includes a working part and a free end. The driving unit is connected with the at least one vibration element. When the driving unit drives the at least one vibration element to vibrate at a vibration frequency, a resonant vibration causes the free end of the vibration element to generate a displacement, so that an airflow is generated at the free end of the vibration element.

In accordance with a further aspect of the present invention, there is provided a heat-dissipating module. The heat-dissipating module is disposed within an electronic device. The heat-dissipating module includes at least one vibration element and a driving unit. The vibration element includes a working part and a free end. The driving unit is connected with the at least one vibration element. When the driving unit drives the at least one vibration element to vibrate at a vibration frequency, a resonant vibration causes the free end of the vibration element to generate a displacement, so that an airflow is generated at the free end of the vibration element to cool the electronic device.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
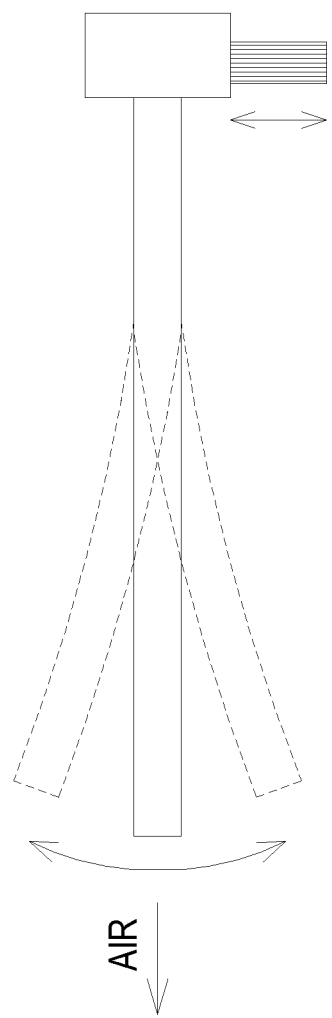
FIG. 1 schematically illustrates a conventional heat-dissipating mechanism disclosed in U.S. Pat. No. 7,061,161.
Figure 2:
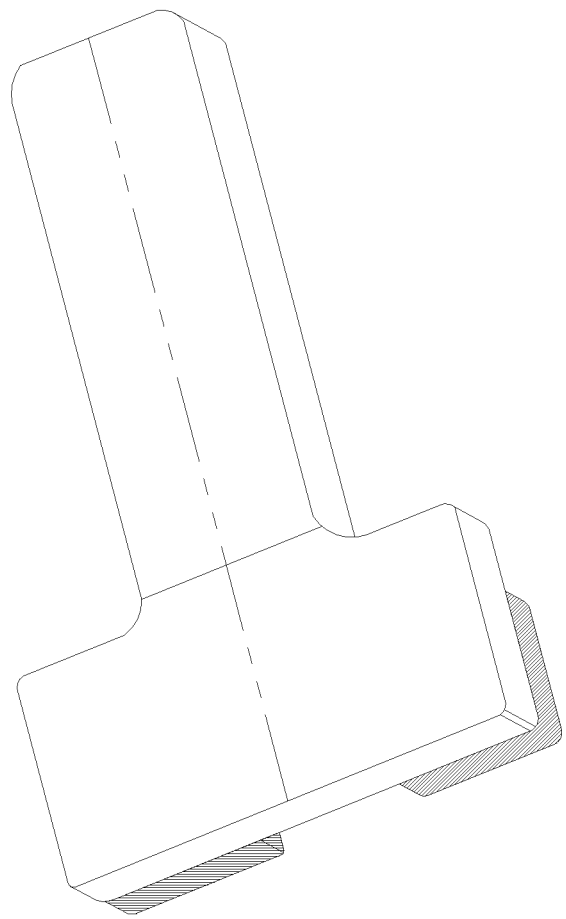
FIG. 2 schematically illustrates a conventional heat-dissipating mechanism disclosed in U.S. Pat. No. 7,358,641.
Figure 3:
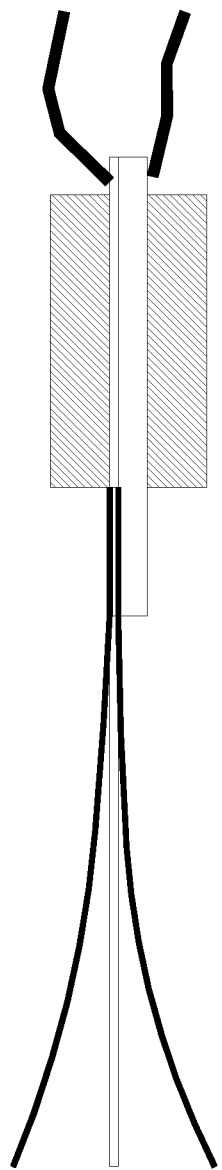
FIG. 3 schematically illustrates a conventional heat-dissipating mechanism disclosed in U.S. Pat. No. 7,742,299.
Figure 4:
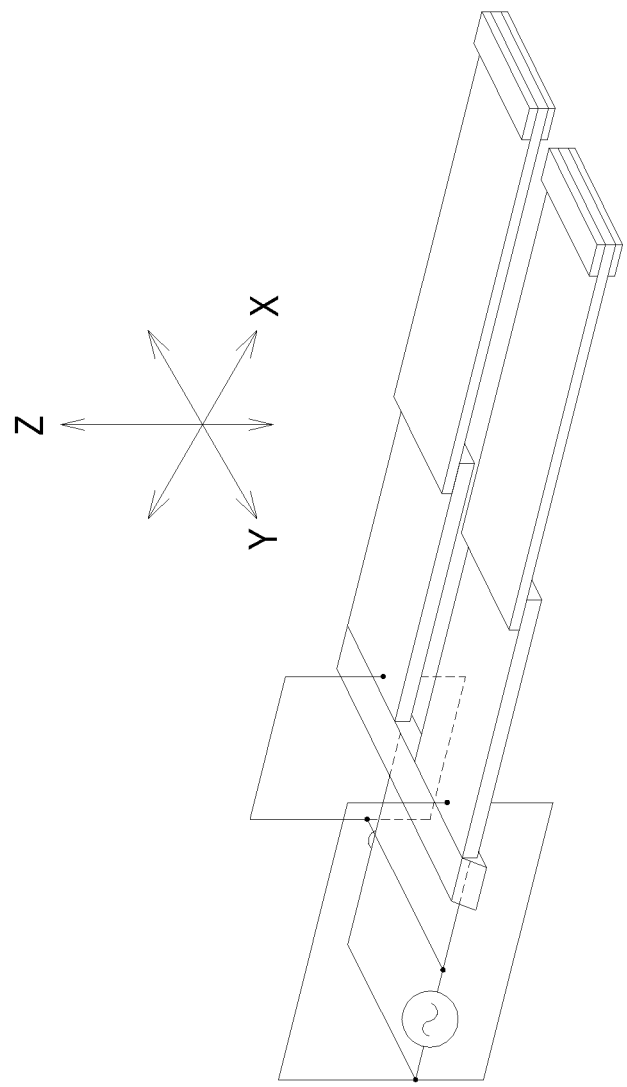
FIG. 4 schematically illustrates a conventional heat-dissipating mechanism disclosed in U.S. Patent Publication No. 20110014069.
Figure 5:
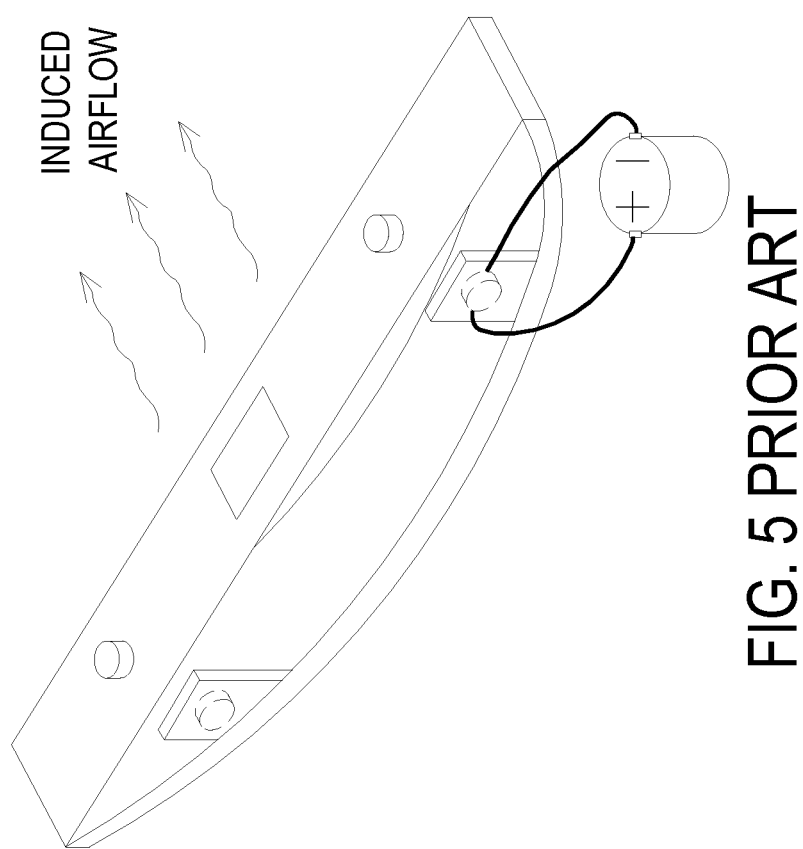
FIG. 5 schematically illustrates a conventional heat-dissipating mechanism disclosed in U.S. Patent Publication No. 20110150669.
Figure 6:
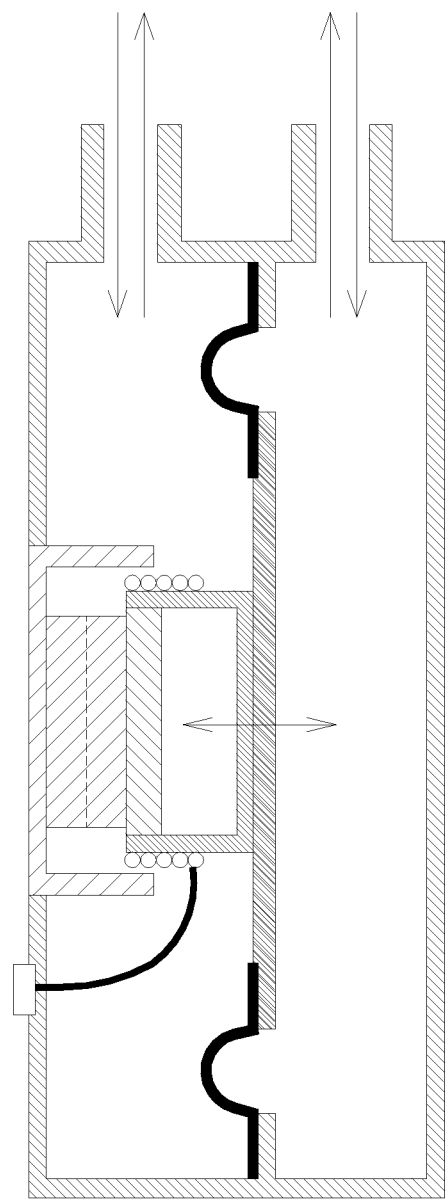
FIG. 6 schematically illustrates a conventional heat-dissipating mechanism disclosed in U.S. Pat. No. 7,793,709.
Figure 7:
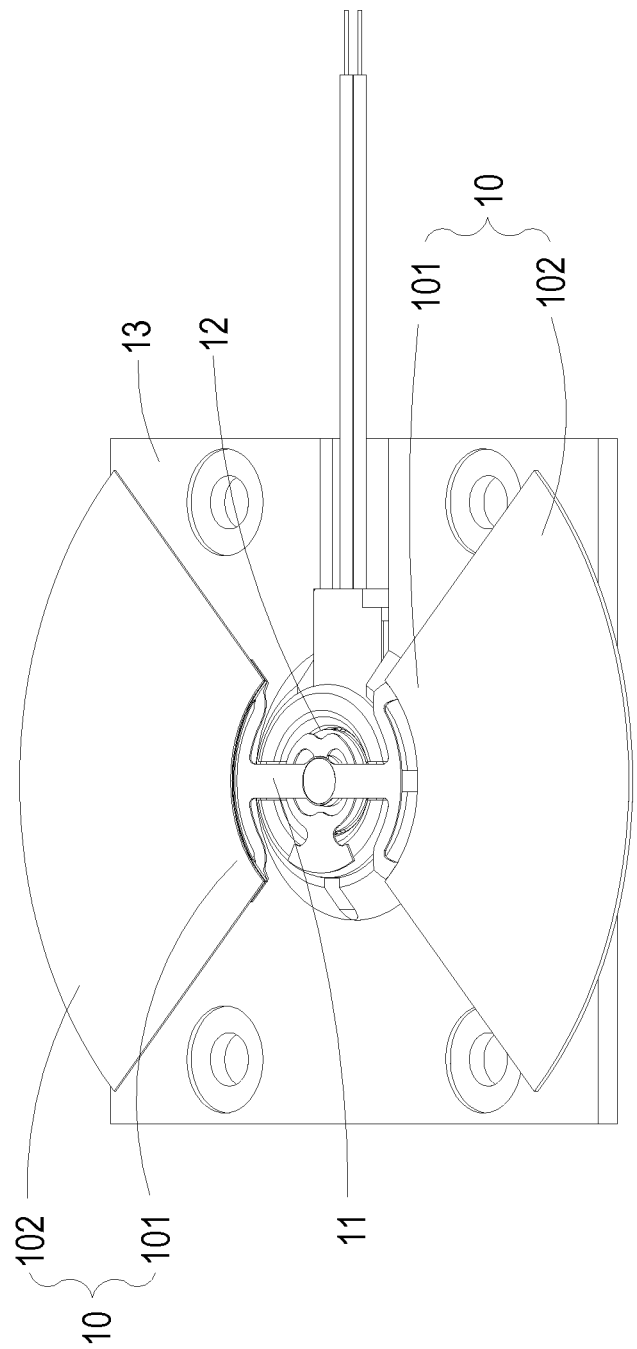
FIG. 7 schematically illustrates a heat-dissipating module according to a first embodiment of the present invention.
Figure 8:
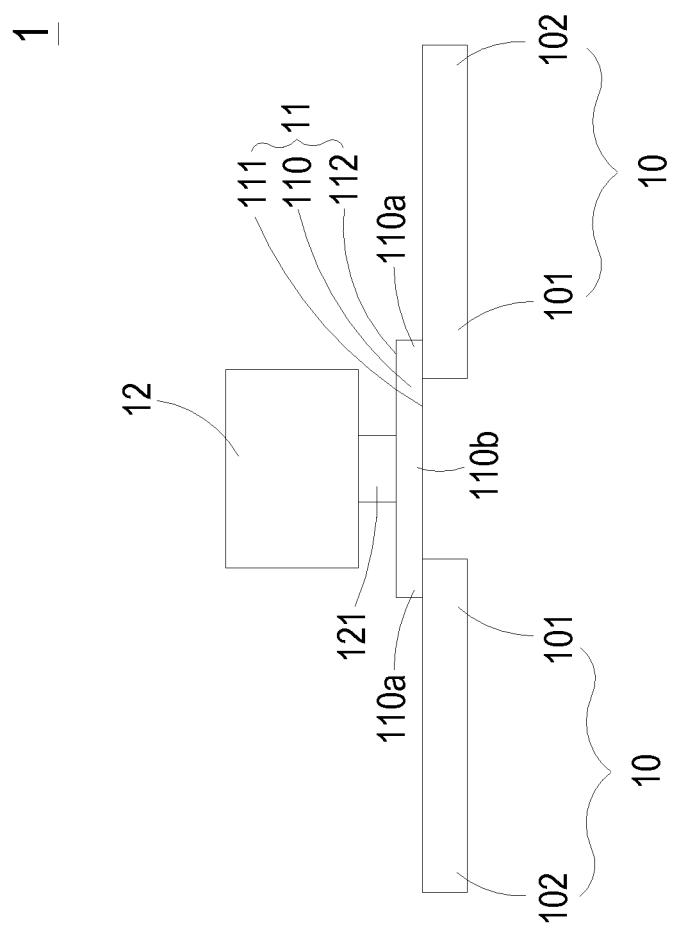
FIG. 8 schematically illustrates the relationships between a vibration element, a bracket and a driving unit of the heat-dissipating module of FIG. 7.
Figure 9:
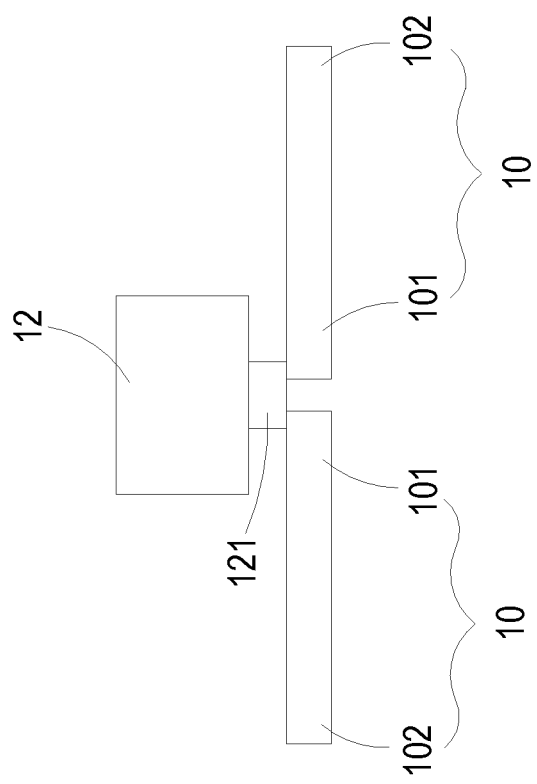
FIG. 9 schematically illustrates a variant example of the heat-dissipating module of FIG. 7.

FIG. 7 schematically illustrates a heat-dissipating module according to a first embodiment of the present invention. FIG. 8 schematically illustrates the relationships between a vibration element, a bracket and a driving unit of the heat-dissipating module of FIG. 7. The heat-dissipating module 1 of the present invention may be applied to a small-sized and portable electronic device (not shown). An example of the small-sized and portable electronic device includes but is not limited to a tablet personal computer or an e-book. In addition, the heat-dissipating module 1 may be used as an airflow generation device for cooling the electronic device. As shown in FIGS. 7 and 8, the heat-dissipating module 1 comprises at least one vibration element 10, a bracket 11, a driving unit 12, and a substrate 13. An example of the vibration element 10 includes but is not limited to a flexible membrane. For example, the flexible membrane is made of polyethylene terephthalate (PET). Moreover, the vibration element 10 comprises a working part 101 and a free end 102. The bracket 11 is connected with the working part 101 of the at least one vibration element 10. The driving unit 12 is disposed on the substrate 13 and connected with the bracket 11. The driving unit 12 drives the bracket 11 to vibrate at a vibration frequency F. Since the working part 101 of the vibration element 10 is connected with the bracket 11, the working part 101 is moved with the bracket 11. The vibration frequency F matches a natural frequency f of the vibration element 10. Due to a resonant vibration, the free end 102 of the vibration element 10 has a displacement. Consequently, the heat-dissipating module 1 generates an airflow at the free end 102 of the vibration element 10 to cool the electronic device. In this embodiment, the bracket 11 comprises a connecting arm 110, a first surface 111, and a second surface 112. The first surface 111 and the second surface 112 of the bracket 11 are opposed to each other. The vibration element 10 is located at an edge 110a of the connecting arm 110, and disposed on the first surface 111 of the bracket 11. The driving unit 12 is disposed on a middle portion 110b of the connecting arm 110, and connected with the second surface 112 of the bracket 11. In this embodiment, a driving part 121 of the driving unit 12 is connected with the bracket 11 by an adhering means or an attaching means. Alternatively, in some embodiments, the working part 101 of the vibration element 10 is directly connected with the driving part 121 of the driving unit 12 by an adhering means or an attaching means (see FIG. 9). In this embodiment, the driving unit 12 is a voice coil motor or a piezoelectric actuator. The operating principles of the voice coil motor and the piezoelectric actuator are well-known in the art, and are not redundantly described herein.

In this embodiment, the vibration element 10 has a sector-shaped profile. Moreover, the working part 101 of the vibration element 10 is located at the edge 110a of the connecting arm 110, and disposed on the first surface 111 of the bracket 11. The driving unit 12 may drive vibration of the bracket 11, thereby driving movement of the working part 101 of the vibration element 10. In some embodiments, the vibration element 10 is a flexible membrane with a natural frequency of 10-200 Hz. Preferably, the vibration element 10 is made of a thin and light material (e.g. PET). As shown in FIGS. 7 and 8, the heat-dissipating module 1 has two vibration elements 10. In addition, these two vibration element 10 are symmetrically located at two edges 110a of the connecting arm 110 of the bracket 11. Consequently, the heat-dissipating module 1 is capable of cooling the heat sources at two regions. The number of the vibration elements 10 may be varied according to the practical requirements. For example, in some embodiments, the heat-dissipating module may have one or more than two (e.g. three) vibration elements 10. Moreover, for increasing the heat-dissipating efficiency, the locations and dimensions of the vibration elements may be determined according to the locations of the heat-generating components (not shown) within the electronic device and the locations of the airflow inlet/outlet on the casing of the electronic device. For example, if the heat-dissipating module has a single vibration element, the airflow generated by the heat-dissipating module may flow to a specified heat source in a single direction. Moreover, a large-sized vibration element may be used to generate a large amount of airflow.

Figure 10:
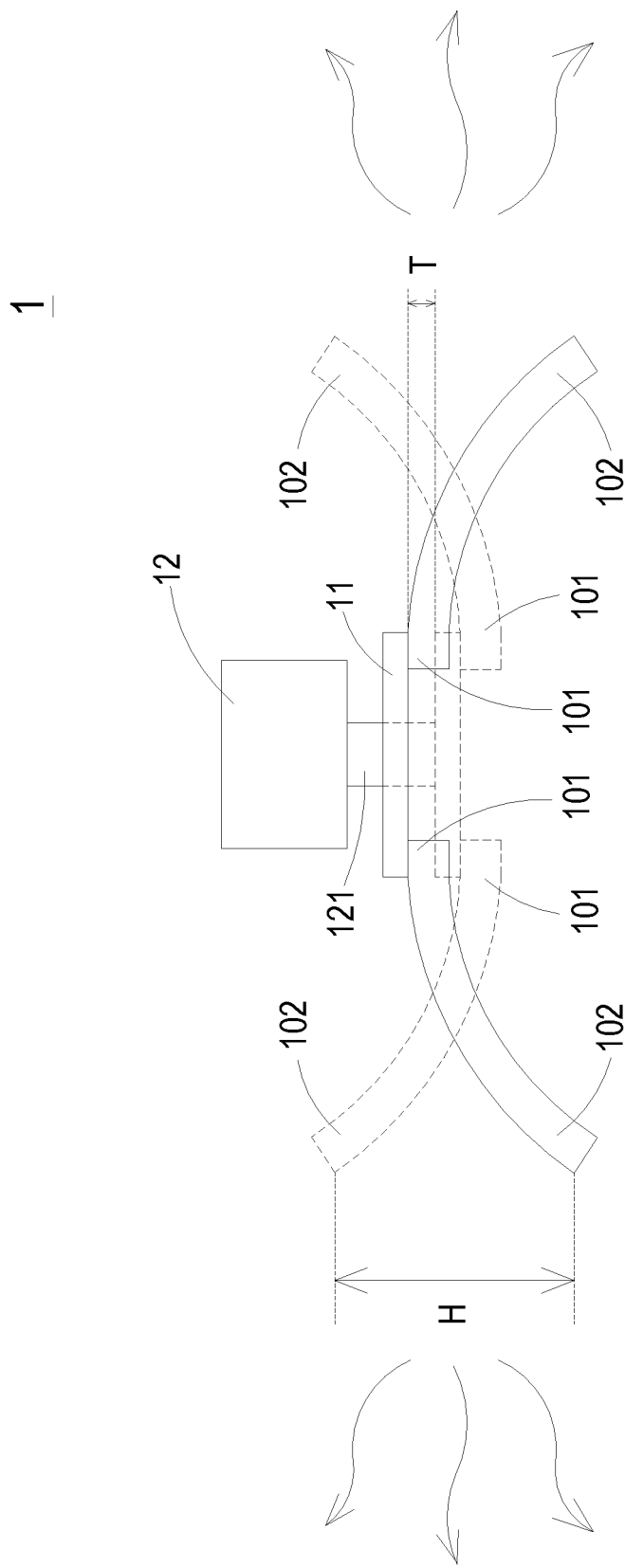
FIG. 10 schematically illustrates the operations of the heat-dissipating module as shown in FIGS. 7 and 8.

FIG. 10 schematically illustrates the operations of the heat-dissipating module as shown in FIGS. 7 and 8. When the driving unit 12 is enabled, the driving part 121 may drive the bracket 11 to vibrate up and down, thereby generating a displacement T of the bracket 11. Since the working part 101 of the vibration element 10 is connected with the bracket 11, the working part 101 of the vibration element 10 also undergoes vibration up and down. Once the vibration frequency F of the driving unit 12 matches the natural frequency f of the vibration element 10, a resonance phenomenon occurs. Due to the resonance phenomenon, the free end 102 of the vibration element 10 undergoes vibration up and down and generates a displacement H. The displacement H is larger than the displacement T. In other words, when the working part 101 of the vibration element 10 is driven by the driving unit 12 to result in a small displacement T, the free end 102 of the vibration element 10 may generate a larger displacement H. Consequently, an airflow is generated at the free end 102 of the vibration element 10 to dissipate away the heat from the electronic components of the electronic device. Moreover, the axial-flow fan or the fins used in the conventional heat-dissipating mechanism may be replaced by the vibration element 10 of the heat-dissipating module 1 of the present invention. Since the vibration element 10 is smaller and thinner than the axial-flow fan or the fins, the overall volume and thickness of the heat-dissipating module 1 are obviously reduced. Under this circumstance, the electronic device is slim.

Figure 11:
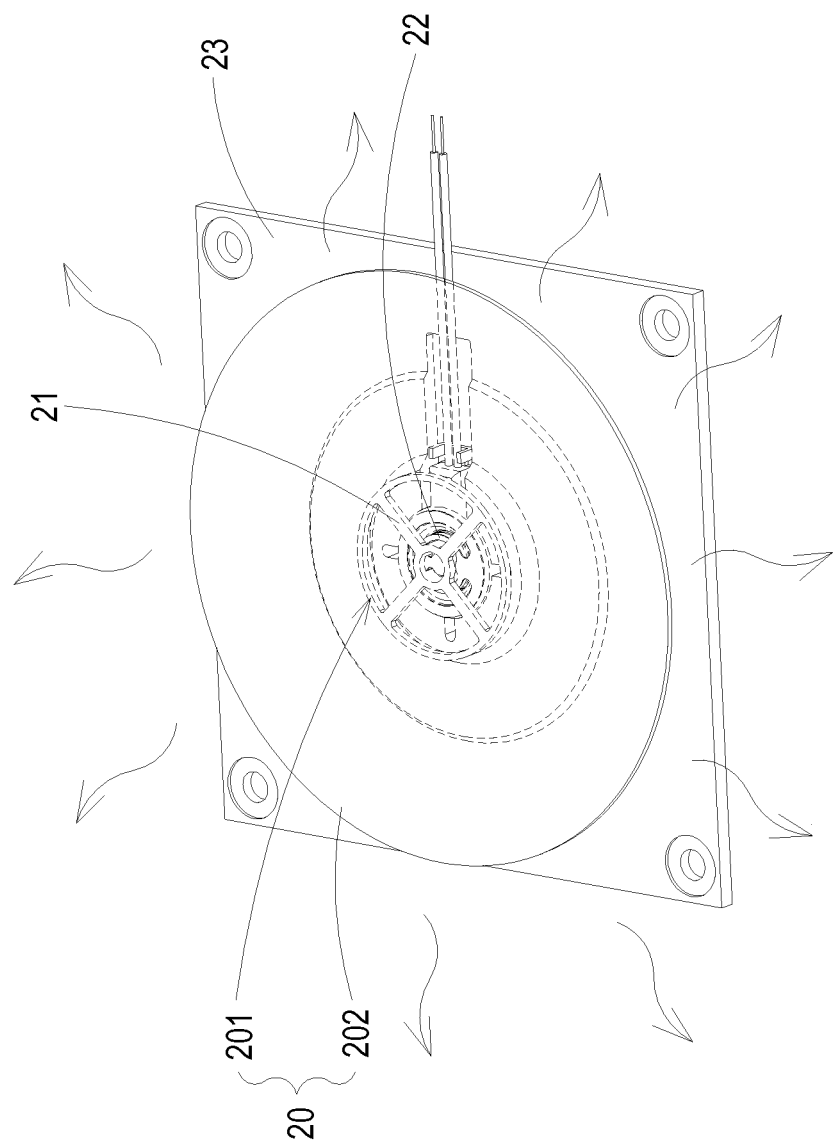
FIG. 11 schematically illustrates a heat-dissipating module according to a second embodiment of the present invention.

It is noted that the profile of the vibration element 10 of the heat-dissipating module 1 may be varied according to the practical requirements. FIG. 11 schematically illustrates a heat-dissipating module according to a second embodiment of the present invention. As shown in FIG. 11, the heat-dissipating module 2 comprises a vibration element 20, a bracket 21, a driving unit 22, and a substrate 23. The configurations of the driving unit 22 and the substrate 23 are similar to those of the first embodiment, and are not redundantly described herein. In this embodiment, the vibration element 20 has a circular disc profile. The vibration element 20 comprises a working part 201 and a free end 202. The working part 201 of the vibration element 20 is connected with the bracket 21. The driving unit 22 is connected with the middle portion of the bracket 21. When the driving unit 22 is enabled, the driving unit 22 may drive the bracket 21 to vibrate up and down. Since the working part 201 of the vibration element 20 is connected with the bracket 21, the working part 201 of the vibration element 20 also undergoes vibration up and down. Once the vibration frequency F of the driving unit 22 matches the natural frequency f of the vibration element 20, a resonance phenomenon occurs. Due to the resonance phenomenon, the free end 202 of the vibration element 20 undergoes vibration up and down and generates a displacement. When the working part 201 of the vibration element 20 is driven by the driving unit 22 to result in a small displacement, the free end 202 of the vibration element 20 may generate a larger displacement. Consequently, an airflow is generated at the free end 202 of the vibration element 20 to dissipate away the heat from the electronic components of the electronic device. Moreover, since the vibration element 20 has a circular disc profile, the airflow generated at the circular free end 202 of the vibration element 20 is a fully-circular airflow. Due to the fully-circular airflow, the heat-dissipating efficacy of the flat electronic device is enhanced.

Alternatively, in some other embodiments, the vibration element 20 of the heat-dissipating module 2 may have a ring-shaped profile. The configurations and operating principles are similar to those of the above embodiments, and are not redundantly described herein.

Figure 12:
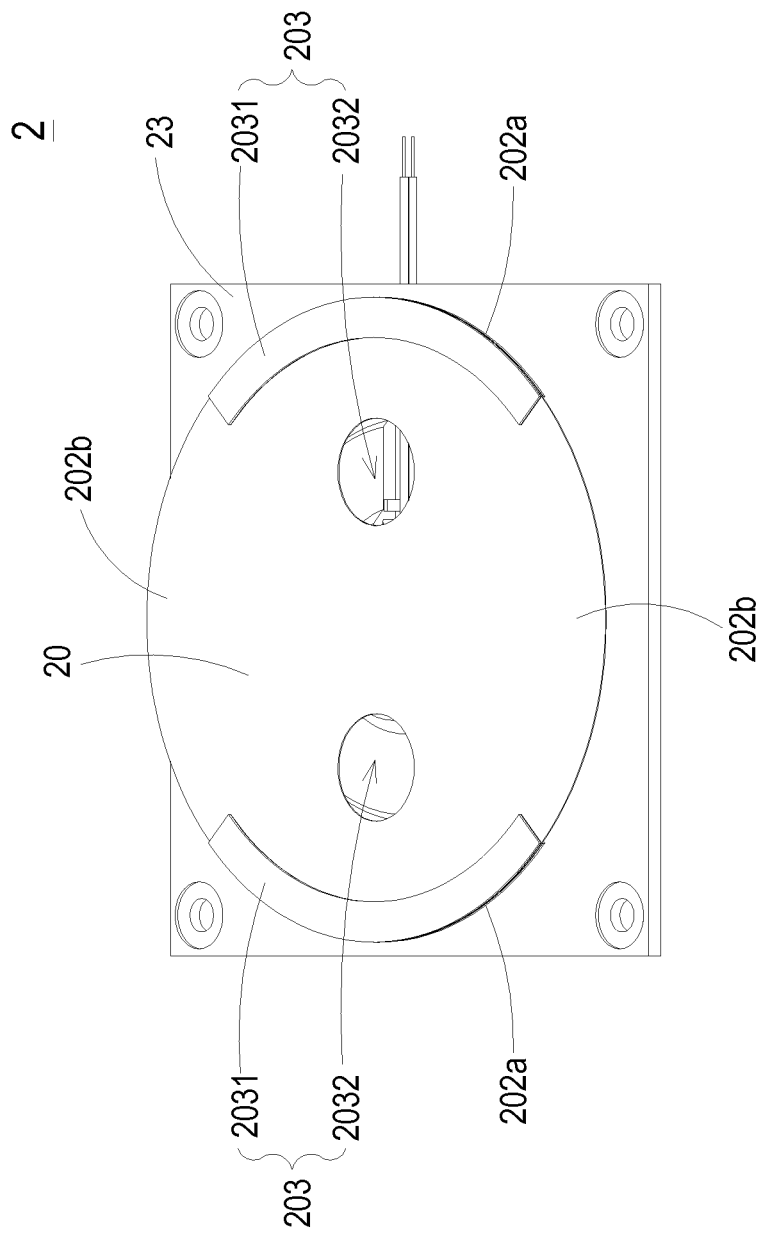
FIG. 12 schematically illustrates a variant example of the heat-dissipating module of FIG. 11.

Moreover, by changing the profile of the vibration element 20, the vibration modes and the natural frequency of the vibration element 20 may be adjusted. For example, by increasing or decreasing the weight of the vibration element 20, the vibration modes and the natural frequency of the vibration element 20 may be adjusted. FIG. 12 schematically illustrates a variant example of the heat-dissipating module of FIG. 11. As shown in FIG. 12, the vibration element 20 further comprises one or more adjustment structures 203. The adjustment structures 203 are used for adjusting the vibration modes and the natural frequency of the vibration element 20. Moreover, by alternately changing the frequency of the voltage inputted into the driving unit 22, different regions of the vibration element 20 alternately generate the resonance phenomena. In an embodiment, the adjustment structures 203 comprise plural weight structures 2031. These weight structures 2031 are disposed on the free end 202 of the vibration element 20 for increasing the overall weight of the vibration element 20. For example, two weight structures 2031 are located at two opposite first regions 202a of the free end 202 of the vibration element 20 in order to increase the overall weight of the vibration element 20. Moreover, the weight structures 2031 are (but not limited to) arc-shaped, wherein the edge of the weight structure 2031 may match the edge of the free end 202 of the vibration element 20. The weight structures 2031 are attached or adhered on the surface of the vibration element 20 along the edge of the free end 202. In some other embodiments, the adjustment structures 203 further comprise plural perforations 2032 or plural concave structures (not shown), which are formed in the surface of the vibration element 20 for decreasing the weight of the vibration element 20. Consequently, the natural frequency of the vibration element 20 is correspondingly adjusted.

By alternately changing the frequency of the voltage inputted into the driving unit 22 of the heat-dissipating module 2, the vibration frequency of the driving unit 22 is correspondingly changed. According to the vibration frequency of the driving unit 22, the vibration modes of the vibration element 20 with the adjustment structures 203 are changed. Consequently, different regions of the vibration element 20 alternately generate the resonance phenomena. For example, the vibration element 20 with the adjustment structures 203 (e.g. the weight structures 2031 and the perforations 2032) has plural natural frequencies (e.g. a first natural frequency f1 and a second natural frequency f2). Once a first frequency F1 of the voltage inputted into the driving unit 22 matches the first natural frequency f1 of the vibration element 20, a resonance phenomenon occurs at the first regions 202a of the free end 202 of the vibration element 20. Consequently, the driving unit 22 drives the first regions 202a to vibrate up and down at larger amplitude when compared with the second regions 202b. Under this circumstance, a larger airflow is generated from the first regions 202a of the heat-generating module 2.

Whereas, once a second frequency F2 of the voltage inputted into the driving unit 22 matches the second natural frequency f2 of the vibration element 20, a resonance phenomenon occurs at the second regions 202b of the free end 202 of the vibration element 20. Consequently, the driving unit 22 drives the second regions 202b to vibrate up and down at larger amplitude when compared with the first regions 202a. Under this circumstance, a larger airflow is generated from the second regions 202b of the heat-generating module 2. In other words, the vibration element 20 can be vibrated in different vibration modes at different vibration frequencies by changing the frequency of the voltage inputted into the driving unit 22. Since the driving unit 22 can selectively drive different regions of the free end 202 of the vibration element 20 to vibrate, the direction of the airflow can be changed to cool different heat sources of the electronic device.

From the above description, the heat-dissipating module of the present invention comprises at least one vibration element, a bracket, a driving unit, and a substrate. The vibration element comprises a working part and a free end. The working part of the vibration element is connected with the driving unit through the bracket. The driving unit may drive the vibration element to vibrate up and down. Moreover, due to a resonant vibration, the free end of the vibration element generates a large displacement. Consequently, an airflow is generated to cool the heat source of the electronic device. Moreover, the vibration element is smaller and thinner than the axial-flow fan or the fins. Consequently, the overall volume and thickness of the heat-dissipating module are obviously reduced, the space utilization of the electronic device is enhanced, and the electronic device is slim. Moreover, for increasing the heat-dissipating efficiency, the locations and number of the vibration elements may be determined according to the locations of the heat-generating components (not shown) within the electronic device and the locations of the airflow inlet/outlet on the casing of the electronic device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating module, comprising:
   at least one vibration element comprising a working part and a free end;
   a bracket connected with said working part of said at least one vibration element; and
   a driving unit connected with said bracket, wherein when said driving unit drives said bracket to vibrate at a vibration frequency, said vibration element is moved with said bracket, and a resonant vibration causes said free end of said vibration element to generate a displacement, so that an airflow is generated at said free end of said vibration element.

2. The heat-dissipating module according to claim 1, wherein said vibration frequency matches a natural frequency of said vibration element.

3. The heat-dissipating module according to claim 2, wherein said natural frequency is in a range between 10 and 200 Hz.

4. The heat-dissipating module according to claim 1, wherein said vibration element is a flexible membrane.

5. The heat-dissipating module according to claim 4, wherein flexible membrane is made of polyethylene terephthalate (PET).

6. The heat-dissipating module according to claim 1, wherein said heat-dissipating module further comprises a substrate, and said driving unit is disposed on said substrate.

7. The heat-dissipating module according to claim 1, wherein said bracket comprises a connecting arm, a first surface, and a second surface, wherein said working part of said vibration element is connected with said connecting arm and disposed on said first surface of said bracket, and said driving unit is connected with said second surface of said bracket.

8. The heat-dissipating module according to claim 1, wherein said driving unit is a voice coil motor or a piezoelectric actuator.

9. The heat-dissipating module according to claim 1, wherein vibration element has a sector-shaped profile, a circular disc profile or a ring-shaped profile.

10. The heat-dissipating module according to claim 1, wherein said vibration element further comprises at least one adjustment structure, wherein said at least one adjustment structure is disposed on a surface of said vibration element for increasing or decreasing weight of said vibration element, thereby changing said natural frequency of said vibration element.

11. The heat-dissipating module according to claim 10, wherein said adjustment structure is a weight structure for increasing weight of said vibration element.

12. The heat-dissipating module according to claim 10, wherein said adjustment structure is a perforation or a concave structure, which is formed in a surface of said vibration element for decreasing weight of said vibration element.

13. The heat-dissipating module according to claim 1, wherein by alternately changing a frequency of a voltage inputted into said driving unit, said vibration element has different vibration modes, so that a direction of said airflow is adjustable.

14. A heat-dissipating module disposed within an electronic device, said heat-dissipating module comprising:
   at least one vibration element comprising a working part and a free end;
   a bracket connected with said working part of said at least one vibration element; and
   a driving unit connected with said bracket, wherein when said driving unit drives said bracket to vibrate at a vibration frequency, said vibration element is moved with said bracket, and a resonant vibration causes said free end of said vibration element to generate a displacement, so that an airflow is generated at said free end of said vibration element to cool said electronic device.

* * * * *